(12) United States Patent
Dasgupta et al.

(10) Patent No.: US 7,629,849 B1
(45) Date of Patent: Dec. 8, 2009

(54) DRIVING AMPLIFIER CIRCUIT WITH DIGITAL CONTROL

(75) Inventors: Uday Dasgupta, Singapore (SG); Alexander Tanzil, Singapore (SG)

(73) Assignee: MediaTek Singapore Pte Ltd., Singapore (SG)

( * ) Notice: Subject to any disclaimer, the term of this patent is extended or adjusted under 35 U.S.C. 154(b) by 9 days.

(21) Appl. No.: 12/131,138

(22) Filed: Jun. 2, 2008

(51) Int. Cl.
*H03F 3/26* (2006.01)
(52) U.S. Cl. .................................. 330/268; 330/267
(58) Field of Classification Search ............. 330/268, 330/267, 264, 263
See application file for complete search history.

(56) References Cited

U.S. PATENT DOCUMENTS

| | | | | |
|---|---|---|---|---|
| 4,607,233 A | * | 8/1986 | Van Tuijl | 330/267 |
| 5,754,078 A | * | 5/1998 | Tamagawa | 330/255 |
| 6,369,653 B1 | * | 4/2002 | Kappes | 330/267 |
| 6,903,610 B2 | * | 6/2005 | Aoki et al. | 330/267 |

OTHER PUBLICATIONS

"A CMOS Large-Swing Low-Distortion Three-Stage Class AB Power Amplifier" IEEE Journal of Solid State Circuits, vol. 25, No. 1, pp. 265-273, Feb. 1990.

* cited by examiner

*Primary Examiner*—Henry K Choe
(74) *Attorney, Agent, or Firm*—Winston Hsu

(57) ABSTRACT

A driving amplifier circuit includes: a first driver for sourcing a load current to a load; a second driver for sinking the load current from the load; a first operational amplifier (op-amp) coupled to a differential input signal for driving the first driver; a second operational amplifier coupled to the differential input signal for driving the second driver; a first bias circuit for biasing the first driver; a second bias circuit for biasing the second driver; an enabling circuit, coupled to the first bias circuit and the second bias circuit, for enabling either the first bias circuit or the second bias circuit according to a control signal; and a digital control circuit, coupled to the enabling circuit, for monitoring currents of the first driver and the second driver to generate the control signal.

8 Claims, 2 Drawing Sheets

DRIVING AMPLIFIER CIRCUIT WITH DIGITAL CONTROL

BACKGROUND OF THE INVENTION

1. Field of the Invention

The invention relates to a driving amplifier, and more particularly, to a driving amplifier that utilizes a digital control for automatically controlling sourcing and sinking of current.

2. Description of the Prior Art

In amplifier design there is always a trade-off between efficiency and crossover distortion. A conventional AB current driving amplifier comprises an operational amplifier coupled to a push-pull stage, to push or pull (source or sink) a current from the load. When sourcing current to the load, a PMOS driver will be utilized, and when sinking current from the load, an NMOS driver will be utilized. Conventional AB class amplifiers utilize a small amount of biasing current to ensure a smoother crossover. If the bias current is too small the amplifier will still suffer some crossover distortion. Furthermore, if both drivers are carrying large currents then a shoot-through current from the power supply may be generated. Therefore, accurate control of the bias current is essential.

A class AB amplifier that has three stages for reducing these problems is disclosed in "*A CMOS Large-Swing Low-Distortion Three-Stage Class AB Power Amplifier*", published in the IEEE journal of solid-state circuits, Vol. 25, No. 1, February 1990, and is included herein by reference. This circuit improves on other conventional implementations, but has complicated circuitry. It is therefore desirable to provide a new operational amplifier that simplifies the circuitry of the above-described three-stage amplifier, while reducing the amount of current carried by the drivers.

SUMMARY OF THE INVENTION

This in mind, the present invention aims to provide an operational amplifier for automatically switching the drivers according to the polarity of the current present in the load.

An operational amplifier according to an exemplary embodiment of the present invention comprises: a first driver for souring a load current to a load; a second driver for sinking the load current from the load; a first operational amplifier (op-amp) coupled to a differential input signal for driving the first driver; a second operational amplifier coupled to the differential input signal for driving the second driver; a first bias circuit for biasing the first driver; a second bias circuit for biasing the second driver; an enabling circuit, coupled to the first bias circuit and the second bias circuit, for enabling either the first bias circuit or the second bias circuit according to a control signal; and a digital control circuit, coupled to the enabling circuit, for monitoring currents of the first driver and the second driver to generate the control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
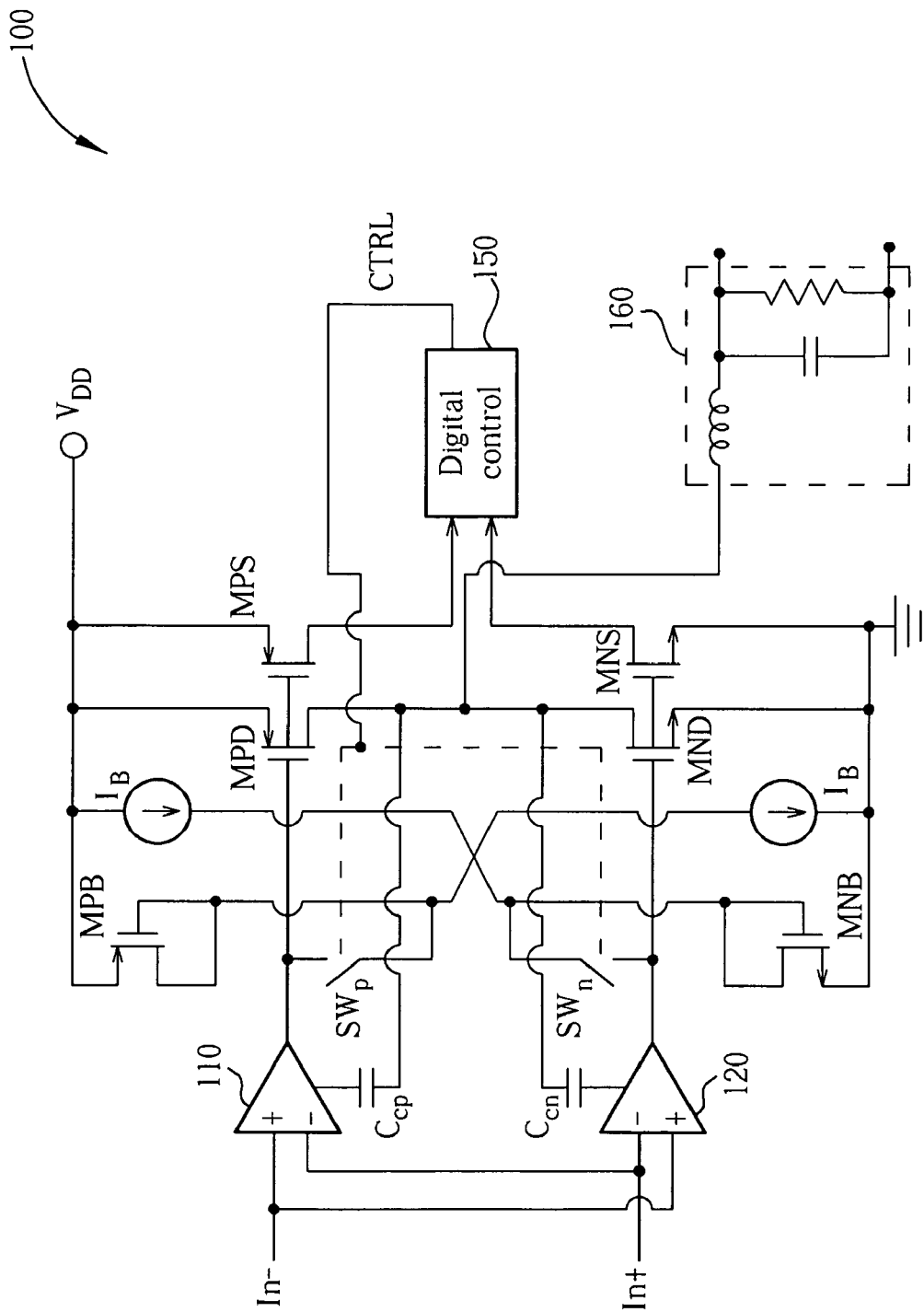
FIG. 1 is a diagram of a driving amplifier according to an exemplary embodiment of the present invention.

Please refer to FIG. 1. FIG. 1 is a diagram of a driving amplifier 100 according to an exemplary embodiment of the present invention. The driving amplifier circuit 100 comprises a p operational amplifier 110 and an n operational amplifier 120 supplied with a differential load current. The p operational amplifier 110 and the n operational amplifier 120 are respectively coupled to a PMOS driver MPD and an NMOS driver MND. The output of the p operational amplifier 110 is further coupled to a first switch $SW_p$, which is coupled to a bias current, and the output of the n operational amplifier 120 is further coupled to a second switch $SW_n$, which is coupled to the bias current. The bias current is supplied by means of a P biasing transistor MPB and an N biasing transistor MNB. The outputs of MPD and MND are coupled to a digital control circuit 150 through, respectively, a first scaling transistor MPS and a second scaling transistor MNS. The output CTRL of the digital control circuit 150 is coupled to the first switch $SW_p$ and the second switch $SW_n$. If CTRL is high, SW-p is open with SW-n closed and vice-versa if CTRL is low.

The circuit 100 utilizes the digital control circuit 150 to activate either MPD or MND through the first switch $SW_p$ and the second switch $SW_n$. When the first switch $SW_p$ is open and the second switch $SW_n$ is closed, the p operational amplifier 110 is directly coupled to MPD for driving MPD to source current to the load 160, so MPD carries the load current $I_L$ plus the biasing current $I_Q$, whereas MND is biased by the biasing current $I_Q$ only. Vice versa, when the first switch $SW_p$ is closed and the second switch $SW_n$ is open, the n operational amplifier 120 is directly coupled to MND for driving MND to sink current from the load 160, so MND carries a current $I_Q-I_L$, and MPD is biased by the biasing current $I_Q$ only.

When the load current becomes zero or positive, this is a sign that the circuit 100 requires sourcing and therefore the drivers will switch at this point, so that MND is biased to $I_Q$ and MPD is active. Similarly, when the load current drops to zero or becomes negative, this is a sign that the circuit 100 requires sinking and the drivers will switch again. Due to the symmetry of the circuit 100, when there is no signal input to the system, the current through both MPD and MND will be equal to $I_Q$ as there is no current in the load. In this situation, any one of MPD or MND can be active.

Figure 2:
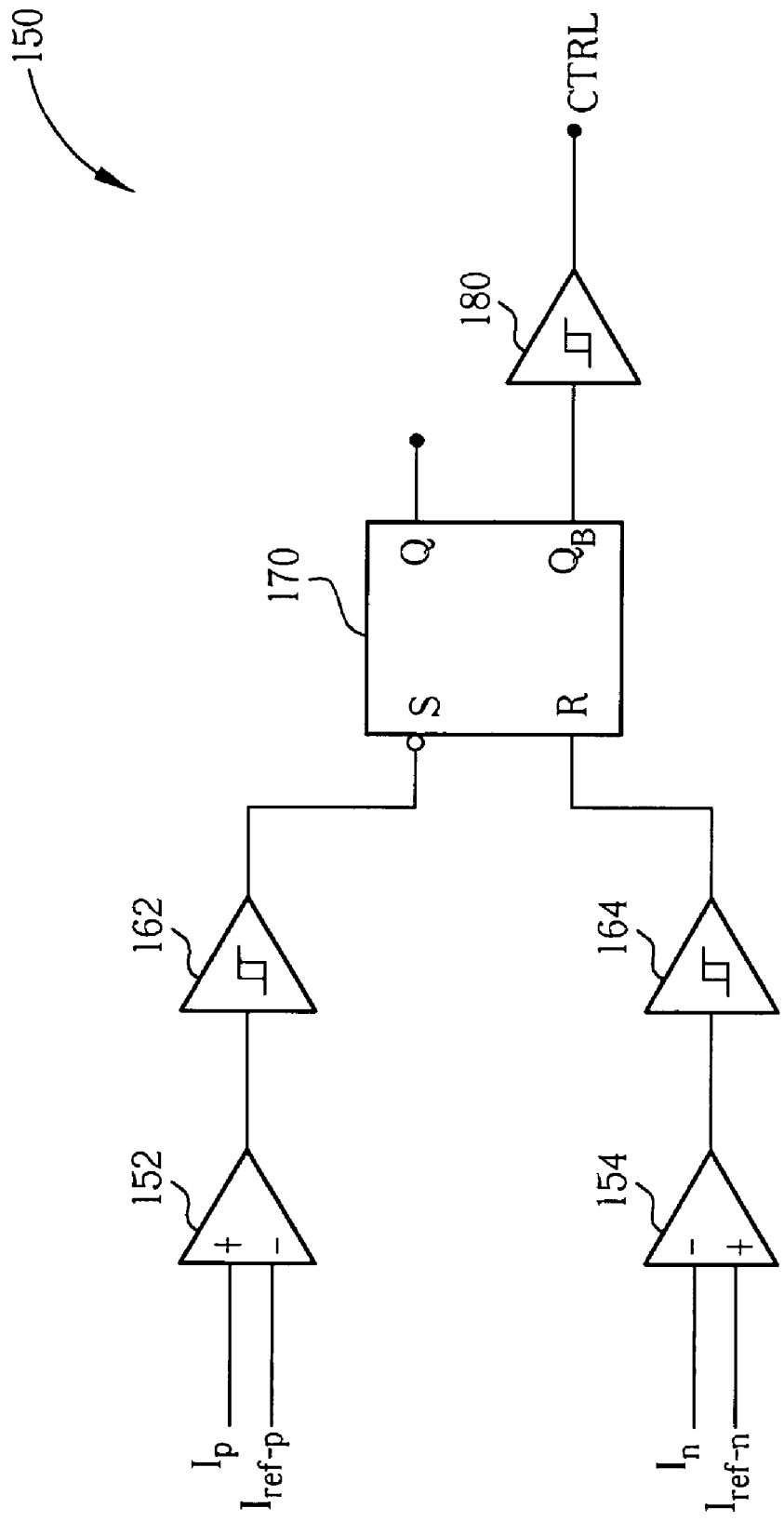
FIG. 2 is a diagram of the digital control circuit shown in FIG. 1.

Please refer to FIG. 2. FIG. 2 is a diagram showing the operation of the digital control circuit 150 shown in FIG. 1. The scaling transistors MPS and MNS carry a small scaled-down version of the currents in the drivers MPD and MND. The digital control circuit 150 consists of a first comparator 152 for comparing a current in MPS with a first reference current, and a second comparator 154 for comparing a current in MNS with a second reference current. The first comparator 152 and second comparator 154 are respectively coupled to a first Schmitt buffer 162 and a second Schmitt buffer 164, for outputting control signals according to the comparison result. These signals are input to a latch circuit 170, and set or reset the latch 170 according to the control signals. Furthermore, when no signal, and therefore, load current is present, the latch 170 will still output a control signal corresponding to a set or a reset state. The output is fed into a third Schmitt buffer 180, and then output to the switches $SW_p$ and $SW_n$.

The operation will now be described with reference to the circuits 100 and 150 in FIG. 1 and FIG. 2. Assume that an initial stage of the circuit 100 has the switch SW-p open, and the switch SW-n closed, with the digital control signal CTRL high, so the circuit 100 is sourcing current and MND has the bias current. The current through MPD is therefore the load current plus the bias current, i.e. $I_Q+I_L$. If the load current falls to zero or below, the p comparator 152 of the digital control circuit 150 will trip and output a signal to the latch 170 indicating that the driver connection needs to be switched. The control signal CTRL will therefore go low, so MPD carries the bias current and MND carries $I_Q-I_L$, and current sinks from the load. If the load current rises again to zero or above, the n comparator 154 of the digital control circuit 150 will trip and therefore reset the latch 170. This causes the control signal CTRL to go high, and MND will carry the bias current and MPD will source current. The two states described above are both stable states. Furthermore, the utilization of the Schmitt buffers can ensure that a constant signal is outputted, as the Schmitt buffers have the hysteresis function. This ensures that, even if a current is oscillating about the reference current, the digital control circuit 150 will not output a constantly changing control signal. When no load current is present, a current through MPD will equal $I_Q$ and a current through MND will equal $-I_Q$. The control signal CTRL will therefore can be either high or low, depending on a previous state of the circuit 100. A stable state of the circuit 100 is still provided.

When the current through MND (for example) approaches zero it will effectively not be seen. But subsequently when the current in MND goes positive and the latch 170 trips the switches $SW_p$ and $SW_n$ so MPD is now sourcing current into the circuit 100, the current through MND will 'jump' back to the bias current $I_Q$.

The circuit 100 therefore provides a totally digital method of automatically switching between sourcing and sinking of current. The use of Schmitt buffers in the digital control circuit 150 allows for this digital control, and also eliminates continuous-time feedback around the digital control circuit 150. The circuitry is less complicated than in conventional implementations, and also prevents the problem of shoot-through currents. Furthermore, the digital control circuit 150 ensures that the circuit 100 is always operating in a stable state, even when no load current is present.

Those skilled in the art will readily observe that numerous modifications and alterations of the device and method may be made while retaining the teachings of the invention.

What is claimed is:

1. A driving amplifier circuit comprising:
   a first driver for souring a load current to a load;
   a second driver for sinking the load current from the load;
   a first operational amplifier (op-amp) coupled to a differential input signal for driving the first driver;
   a second operational amplifier coupled to the differential input signal for driving the second driver;
   a first bias circuit for biasing the first driver;
   a second bias circuit for biasing the second driver;
   an enabling circuit, coupled to the first bias circuit and the second bias circuit, for enabling either the first bias circuit or the second bias circuit according to a control signal; and
   a digital control circuit, coupled to the enabling circuit, for monitoring currents of the first driver and the second driver to generate the control signal.

2. The driving amplifier circuit of claim 1, wherein the enabling circuit comprises:
   a first switch for coupling the first driver to the first bias circuit according to the control signal; and
   a second switch for coupling the second driver to the second bias circuit according to the control signal.

3. The driving amplifier circuit of claim 2, wherein when the control signal has a first logic level, the first switch is open and the second switch is closed, so the first driver is active and the second driver is biased, and when the control signal has a second logic level, the first switch is closed and the second switch is open, so the first driver is biased and the second driver is active.

4. The driving amplifier circuit of claim 1, wherein the digital control circuit compares the currents of the first driver and the second driver with respective reference currents and utilizes comparison results to generate the control signal to the enabling circuit.

5. The driving amplifier circuit of claim 4, wherein the digital control circuit comprises:
   a first current comparator, for comparing the current of the first driver with a first reference current;
   a second current comparator, for comparing the current of the second driver with a second reference current;
   a first Schmitt buffer coupled to the first current comparator, for outputting a first trigger signal according to a comparison result of the first current comparator;
   a second Schmitt buffer coupled to the second current comparator, for outputting a second trigger signal according to a comparison result of the second current comparator; and
   a latch, coupled to the first Schmitt buffer and the second Schmitt buffer, for outputting the control signal according to the first trigger signal and the second trigger signal.

6. The driving amplifier circuit of claim 5, wherein the digital control circuit further comprises:
   a third Schmitt buffer, coupled to the latch, for buffering the control signal.

7. The driving amplifier circuit of claim 5, wherein the first reference current has an absolute value between zero and a bias current magnitude of the biased first driver, and the second reference current has an absolute value between zero and a bias current magnitude of the biased second driver.

8. The driving amplifier circuit of claim 1, further comprising:
   a first scaling circuit, coupled to the first driver, for generating a first scaled current proportional to the current of the first driver to the digital control circuit; and
   a second scaling circuit, coupled to the second driver, for generating a second scaled current proportional to the current of the second driver to the digital control circuit;
   wherein the digital control circuit monitors the first scaled current and the second scaled current to generate the control signal.

* * * * *